United States Patent [19]

Murase et al.

[11] Patent Number: 4,776,899

[45] Date of Patent: Oct. 11, 1988

[54] METHOD OF FABRICATING MULTIFILAMENT SUPERCONDUCTORS

[75] Inventors: Satoru Murase, Yokohama; Hachio Shiraki, Kawasaki; Eigen Suzuki, Yokohama; Masamitsu Ichihara, Yokohama; Yoshimasa Kamisada, Yokohama; Nobuo Aoki, Yokohama; Tomoyuki Kumano, Yokohama, all of Japan

[73] Assignees: Kabushiki Kaisha Toshiba; Showa Electric Wire and Cable Company Limited, both of Japan

[21] Appl. No.: 62,401

[22] Filed: Jun. 15, 1987

Related U.S. Application Data

[63] Continuation of Ser. No. 786,128, Oct. 10, 1985, abandoned, which is a continuation-in-part of Ser. No. 666,037, Oct. 29, 1984, abandoned.

[30] Foreign Application Priority Data

Oct. 31, 1983 [JP] Japan .................. 58-204209

[51] Int. Cl.[4] ............................................. H01L 39/24
[52] U.S. Cl. ..................... 148/11.5 F; 148/11.5 Q; 148/11.5 C; 29/599
[58] Field of Search ................... 420/557; 148/11.5 Q, 148/11.5 F, 127; 29/599; 174/128 S, 126 S; 428/930, 614, 647, 674, 662

[56] References Cited

U.S. PATENT DOCUMENTS

| | | | |
|---|---|---|---|
| 3,905,839 | 9/1975 | Hashimoto | 148/11.5 R |
| 4,224,735 | 9/1980 | Young et al. | 29/599 |
| 4,323,402 | 4/1982 | Tachikawa et al. | 428/930 |
| 4,385,942 | 5/1983 | Tachikawa et al. | 148/11.5 Q |
| 4,411,712 | 10/1983 | Marancik | 148/11.5 Q |
| 4,419,145 | 12/1983 | Tachikawa et al. | 148/11.5 Q |
| 4,435,228 | 3/1984 | Tachikawa et al. | 428/930 |
| 4,489,219 | 12/1984 | Suenaga et al. | 174/128 S |

FOREIGN PATENT DOCUMENTS

| | | | |
|---|---|---|---|
| 0048313 | 3/1982 | European Pat. Off. | |
| 2620271 | 3/1977 | Fed. Rep. of Germany ... 174/128 S |
| 25983 | 2/1980 | Japan ................... 29/599 |

OTHER PUBLICATIONS

IEEE Transactions on Magnetics, MAG-19 (1983), May, No. 3, Part 2, pp. 1429-1432.
IEEE Transactions of Magnetics, MAG-15, No. 1 (1979-01), pp. 83-86.
1982 Journal Article by Tachikawa et al, "Composite--Processed Nb3Sn with Titanium Addition to the Matrix", Jul.-pp. 5354-5356.
Article by Kamata et al, "High-Field Current-Carrying Capacities of 'Titanium Bronze' Processed Multifilamentary Nb3Sn Conductors.
Article by Koike et al—Applied Physics Letters, vol. 29, No. 6, Sep. 15, 1976, pp. 384-386.

*Primary Examiner*—John J. Zimmerman
*Attorney, Agent, or Firm*—Foley & Lardner, Schwartz, Jeffery, Schwaab, Mack, Blumenthal & Evans

[57] ABSTRACT

An improved multifilament superconductor is fabricated by the method in which a tin rod or tin based alloy rod is clad with a copper based alloy tube, the thus obtained copper-clad rod is further clad with a niobium based alloy tube, and a copper material is applied as a stabilizer on an outer peripheral surface of the niobium based alloy tube to form a composite. This composite is then reduced and thermally treated at a temperature ranging from 640° to 770° C. to thereby form an Nb$_3$Sn superconductor composite with a filament tube therein. At least one of the copper based alloy tube and the niobium based alloy tube contains 0.1-5.0 at. % titanium, and in addition, the tin based alloy rod may contain 0.1-3.5 at. % titanium. The tin is contained in the copper-clad rod at weight % of about 25-85, preferably 30-80 weight %.

11 Claims, 3 Drawing Sheets

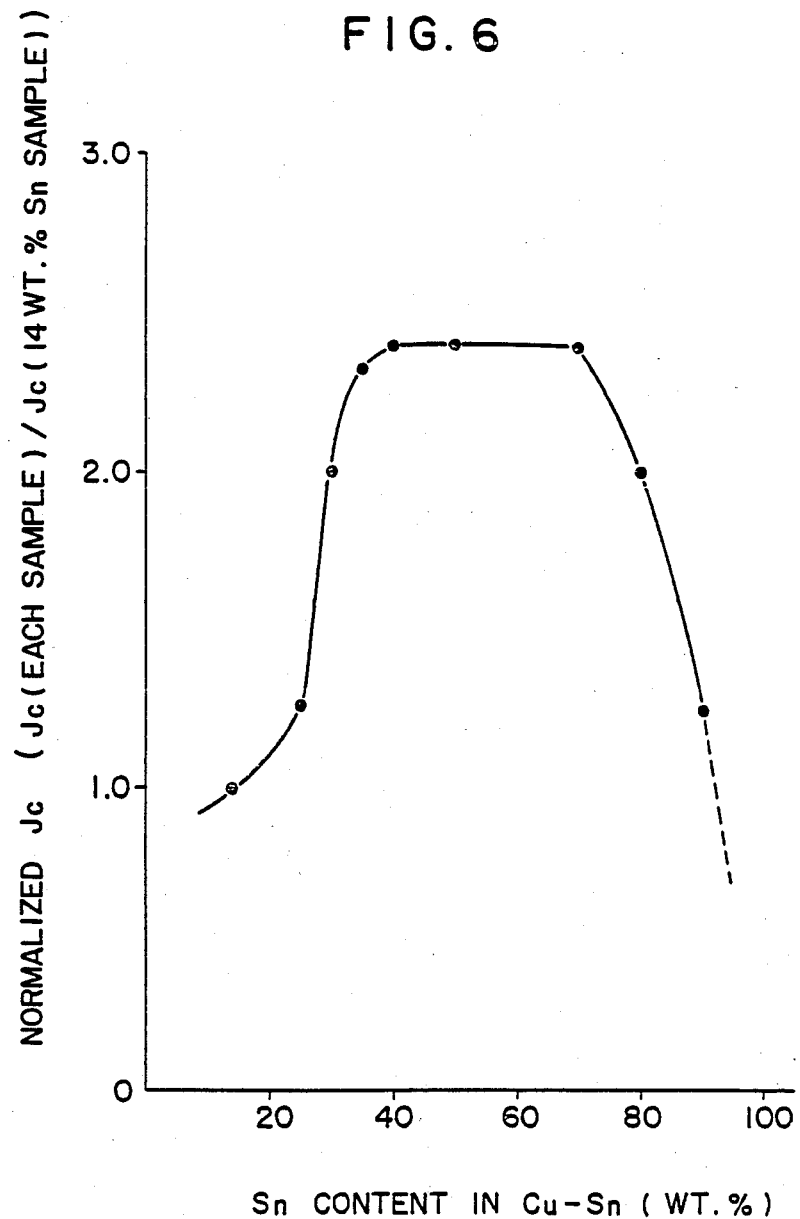

METHOD OF FABRICATING MULTIFILAMENT SUPERCONDUCTORS

This application is a continuation of U.S. patent application Ser. No. 786,128, filed 10-10-85, now abandoned, which is a continuation-in-part application of the U. S. patent application Ser. No. 666,037, filed 10-29-84, now abandoned.

BACKGROUND OF THE INVENTION

This invention relates to an improvement in fabrication of multifilament superconductors, and more particularly, to a method for fabricating multi-filament $Nb_3Sn$ superconductors.

In the art of this field, for the fabrication of multifilament $Nb_3Sn$ superconductors are generally well known two methods, one being called as a bronze technique in which a copper-tin (bronze) alloy including 13-14 weight % tin is utilized as a matrix material in which a niobium or niobium based alloy rod is arranged. Reducing operation is applied to the thus made composite under the repeated heating and annealing operations, and thereafter, the composite material is heat treated to thereby form $Nb_3Sn$ layer in the composite. However, difficulties associated with this bronze technique lie in that because the high extent of work hardening is required for the bronze alloy including 13-14 weight % of tin, one intermediate annealing under a temperature of about 500°-650° C. would be required every time when the reducing working rate reaches 40-60% during the reducing operation in order to lower the hardness of the bronze alloy increased during the working, which requires a large number, i.e. several tens of times, of the intermediate annealings throughout the entire working operation, and in addition, this treatment must be done in a non-oxidizing atmosphere, which requires specific equipments or treatment therefor, thus being disadvantageous.

In addition, it is known that the upper limit of Sn content in the bronze alloy is about 14 weight %, and when the Sn content increases over this upper limit, a breakage may occur in the working operation thereof, and in a certain case, it may be difficult to work the bronze alloy even if the intermediate annealings are carried out. In order to eliminate such intermediate annealing processes, several methods have been proposed in the art of this field such as disclosed in U.S. Pat. Nos. 4,435,228, 4,419,145 and 4,385,942 to Tachikawa et al.

One method is generally called an internal diffusion method in which Sn core is disposed at substantially the central portion of a composite including an Nb based alloy rod disposed in Cu matrix, and the thus prepared material is then subjected to reducing operation. Thereafter, a preheating procedure is carried out and diffusion heat treatment is then performed for forming an $Nb_3Sn$ layer, thereby to obtain a multi-filament superconductor. In this method, however, it is required to carry out the preheat treatment for diffusing evenly throughout the Cu matrix, i.e. whole Nb filaments, this preheat treatment requiring much time such as about one month, thus being not effective and economical. Moreover, in the internal diffusion method, the Sn in the Cu-Sn composite might be dissolved during the pretreatment in a case where the Sn content is over about 20% in surface area ratio, which results in less workability.

The other method is generally called an external diffusion method in which a composite including the Nb based alloy rod arranged in the Cu matrix is reduced, and the Sn plating is then effected. The composite is preheated to thereby form the $Nb_3Sn$ layer by means of diffusing heat treatment, thus obtaining composite superconductor. In this external diffusion method, however, the preheating treatment for diffusing the Sn entirely in the Cu matrix requires much time, and moreover, the diffusing distance is limitted to an extent of about 0.7 mm, so that it is considerably hard to manufacture a superconductor through which large current can pass. In addition, the technique for thickening the thickness of the Sn plating to increase the Sn content in the Cu-Sn composite includes a problem of excessive fusing of Sn during the preheating procedure. Accordingly, in the external diffusing method, the Sn content is limitted to about 14 weight % as in the bronze method described hereinbefore.

There is further proposed a method generally called an Nb tube technique, such as disclosed in German DT No. 2,620,271, in which a material requiring no work hardening for eliminating intermediate annealings is utilized and in which a tin rod clad with copper is located inside the niobium tube and a copper is also placed on the outer surface of the niobium tube as a stabilizer. A plurality of composites thus made are bundled and subjected to the reduction operation and then heat treated to form the $Nb_3Sn$ layer in the composites. However, in this known Nb tube technique, since the niobium tube is utilized instead of the niobium based alloy rod, problems different from those observed in case of using the niobium based alloy rod arise during the reducing operation as the operation with high working rate progresses. That is, in case of fabricating a fine filamentary pipe in which the reducing degree of the composite from the time of initial assembling of the composite is over $10^4$, injuries will be formed on the wall of the niobium tube composite in the form of a filamentary pipe, hereinafter referred to as filament injury, and in addition, breakages of the niobium tube composite in the form of a filamentary pipe will occur, hereinafter referred to as filament breakage. When a superconductor filament composed of the niobium tube with these filament injuries or breakages is heat treated, tin contained in the niobium tube adversely disperses outside the tube to thereby lower the critical current ($I_c$) or contaminate the copper matrix with the tin, which may result in instability of the cooling thereof. In case that the reducing working is carried out at the low reducing rate so that such adverse phenomena as described above will not occur, the niobium tube thus worked is obliged to have a considerably large diameter and the $Nb_3Sn$ layer formed by the heat treatment is obliged to be considerably thick, which may result in the lowering of the critical bending strain ($\epsilon_{bc}$) or increasing of the AC (alternating current) loss, thus being disadvantageous.

With this method, also, as well as the bronze method, internal diffusion method, and external diffusion method, it is difficult to increase the Sn content in the Cu-Sn composite, and with a multifilament superconductor suitable for a practical use in which each filament has a diameter of less than several tens of $\mu m$, it is not practical to increase the Sn content over about 20 weight %.

In the foregoing description, the reducing rate is prescribed by (cross sectional area of a composite before the reducing working—that after the reducing working)/(cross sectional area of a composite before the reducing working)×100 (%), and the reducing degree is represented by a ratio of (cross sectional area of a composite before the reducing working) to (that after the reducing working).

SUMMARY OF THE INVENTION

An object of this invention is to eliminate defects or problems encountered in a method of fabricating superconductors in the prior art and to provide a method for fabricating multifilament superconductors which are preliminarily endowed with the characteristic features of the conventional Nb tube method as well as an excellent workability including no filament breakage and injuries, highly improved critical current, and high critical bending strain, thus being stabilized with reduced alternating current loss by adding titanium and high content of tin.

According to this invention, for achieving this and other objects, there is provided a method of fabricating multifilament superconductors in which a tin rod or tin based alloy rod is clad with a copper based alloy tube, the thus obtained copper-clad rod is further clad with a niobium based alloy tube, a copper material is applied as a stabilizer on an outer peripheral surface of the niobium based alloy tube to form a composite, the composite is reduced and thermally treated at a temperature between 640°–770° C. to thereby form an $Nb_3Sn$ superconductor composite with a filament tube therein, and particularly, at least one of the copper based alloy tube and the niobium based alloy tube contains 0.1–5.0 at. % titanium, and in addition, the tin based alloy rod may contain 0.1–3.5 at. % titanium. The tin is contained in the copper-clad rod at weight % of about 25–85 and preferably 30–80 weight %.

Furthermore, according to the method of this invention, a difference between hardnesses of the copper based alloy tube and the niobium based alloy tube sheathing the copper based alloy tube is effectively reduced by making 0.1–5.0 at. % titanium be contained in at least one of these alloy tubes, whereby mutual tightness between these alloy tubes can be extremely improved during the reducing operation and the niobium based alloy tube having substantially the true circular cross section can be obtained even under the highly reduced condition. Accordingly, the occurrences of filament breakages and filament injuries of the niobium based alloy tube in the form of a filamentary tube can be significatly prevented, thus improving the workability of the multifilament superconductors. In addition, according to the multifilament superconductors thus fabricated, there is observed no occurrence of the filament breakage of the niobium based alloy tube, so that the tin is not dispersed in the copper matrix applied as a stabilizer on the outer surface of the niobium based alloy tube when the tube is thermally treated. For the reasons described above, the critical current can be increased, and moreover, the low thermal resistance to the copper matrix can be maintained because the copper matrix is not contaminated by the dispersed tin. In addition, the niobium based alloy tube is reduced so as to have a relatively highly reduced diameter with a reduced thickness, and moreover, since a high critical current is obtained, even if the tin contained in the niobium based alloy tube were reacted with almost all the niobium in the tube, the $Nb_3Sn$ layer formed has less thickness, thereby to significantly improve the critical bending strain and to reduce the alternating current loss.

According to this invention, can easily be fabricated a composite in which the Sn content of the Cu-Sn composite alloy necessary to form the $Nb_3Sn$ layer can be made over about 25 weight % and below about 80 weight %, which is not attained in the conventional bronze method or other diffusion methods, thus being obtained an excellent superconductor. The $Nb_3Sn$ layer formed by the reaction of the Cu-Sn composite including Sn content of 25–80 weight % with respect to the Cu and the Ti added material possesses an extremely high critical current density (Jc) with a high magnetic field of over 10 Tesla as well as a low magnetic field of less than 10 Tesla by the synergistic effect of the Sn of high content and the Ti addition in comparison with the conventional superconductor which is obtained by the conventional methods described hereinbefore in which the Sn cannot be contained over about 20%. Moreover, an unexpected effect such as rapid increasing of the critical current density can be attained when the Sn content increases over about 25 weight %. Accordingly, since the extremely high critical current density (Jc) can be obtained in both the high and low magnetic fields, in a case where the thus made superconductor is utilized for a magnet means, a required magnetic field can be attained by a relatively small amount of the superconductor and a compact magne means is obtained in comparison with the use of the conventional superconductor. The compactness of the magnet effectively results in the reduction of the liquid He required for the cooling thereof, thus being capable of lowering the cost of the whole magnet system.

For example, in the conventional bronze method, the increasing of the critical current density (Jc) and the critical current (Ic), respectively, due to the Ti addition were not observed; indeed, decreases in Jc and Ic were found. Moreover these phenomena were remarkably observed in the high magnetic field.

BRIEF DESCRIPTION OF THE DRAWINGS

In the accompanying drawings:

FIG. 6 is a graph representing a relationship between the Sn content (weight %) in the Cu-Sn composite and critical current density according to this invention.

DESCRIPTION OF THE PREFERRED EMBODIMENTS

This invention will clearly be understood by those skilled in the art from Examples described hereunder in conjunction with FIGS. 1 through 6.

EXAMPLE 1

Figure 1:
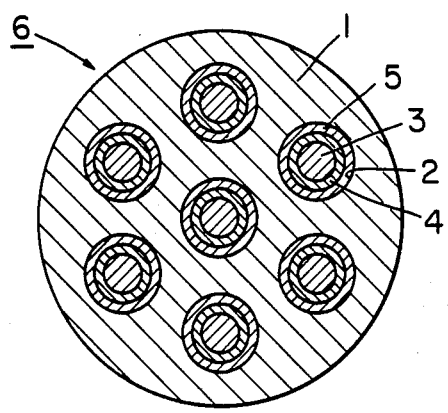
FIGS. 1 and 2 show cross sectional views, partially in FIG. 2, of a multifilament superconductor according to one example of the method of this invention.

FIG. 1 shows a cross sectional view of a composite 6 in which a matrix 1 is composed of an oxygen free copper having an electric resistance ratio of 150 at a temperature of 4.2K with respect to a room temperature. The matrix 1 is provided with a plurality of parallel holes 2, along the axial length thereof, each having an inner diameter of 8 mm, into which is inserted a filament comprising a tin rod 3 which is clad with a copper based alloy tube 4 which is further clad with a niobium based alloy tube 5 having an inner diameter of 5.6 mm and an outer diameter of 8 mm. In an actual experiment, sixteen kinds of composites 6 each consisting of elements having the same dimensional relationships, respectively, were prepared, and moreover, ten composites 6 were prepared for the respective kinds of the composites 6. These one hundred and sixty composites 6 were roughly classified into the following five groups.

(1) Forty composites belonging to a group consisting of composites 1a, 1b, 1c and 1d, which were fabricated as references, and in which conventional copper based alloy tubes and niobium based alloy tubes were utilized.

(2) Thirty composites belonging to a group consisting of composites 2a, 2b and 2c, in which 2a, 2b and 2c utilize the copper based alloy tubes each containing 0.2 at. %, 0.4 at. % and 0.6 at. % titanium (Ti), respectively.

(3) Thirty composites belonging to a group consisting of composites 3a, 3b and 3c, in which 3a, 3b and 3c utilize the niobium based alloy tubes each containing 1 at. %, 2.5 at. % and 4 at. % titanium, respectively.

(4) Thirty composites belonging to a group consisting of composites 4a, 4b and 4c, in which 4a, 4b and 4c utilize the copper based alloy tubes and the niobium based alloy tubes containing the titanium in at. % shown in the following Table 1.

(5) Thirty composites belonging to a group consisting of composites 5a, 5b and 5c, in which 5a, 5b and 5c utilize the copper based alloy tubes containing 0.4 at. % titanium.

Figure 2:
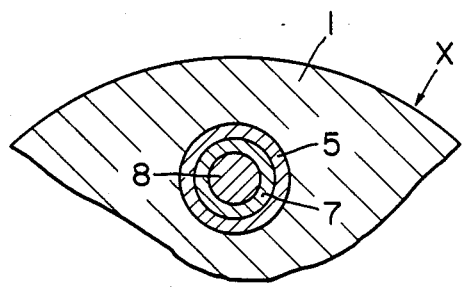

The one hundred and sixty composites classified into sixteen kinds as described above were reduced by a static pressure extrusion and cold drawing working as shown in the Table 1 with reducing degree of $10^4$–$10^6$ to obtain a fine composite having a diameter of about 0.8 mm. Thereafter, the thus reduced composites were twisted and heat treated with a temperature of 725° C. to obtain multifilament superconductors X in each of which $Nb_3Sn$ layer 7 is formed inside the niobium based alloy tube 5 as shown in FIG. 2, in which reference numeral 8 designates Cu-Sn alloy layer after the treatment.

With the thus obtained one hundred and sixty multifilament superconductors, the filament breakages of the niobium alloy tubes, the filament injuries of the niobium alloy tube and the critical currents ($I_c$) were measured by locating the obtained multifilament superconductors in the ten Tesla magnetic field at a temperature of 4.2K. In the actual measurement of the filament injury, each multifilament superconductor was cut into twelve pieces along its longitudinal direction and ten cut cross sectional end faces were observed by a microscope to find out the filament injury. In the filament breakage measurement, the outer copper layers of the ten pieces of the twelve pieces except both ends of the cut multifilament superconductor were dissolved and removed by using nitric acid, and thereafter, the cross sectional areas of the respective pieces were observed by the microscope. The average value of the critical currents measured, the occurrences (%) of the filament injuries and the filament breakages were obtained and summarized in the following Table 1.

TABLE 1

| | Class | A | B | C | D | E | F |
|---|---|---|---|---|---|---|---|
| Examples of Prior Art Method | 1a | — | — | $10^6$ | 12 | 80 | 30 |
| | 1b | — | — | $10^5$ | 5 | 100 | 10 |
| | 1c | — | — | $5 \times 10^4$ | 3 | 110 | 7 |
| | 1d | — | — | $10^4$ | 2 | 120 | 4 |
| Examples of the Method of this Invention | 2a | 0.2 | — | $10^5$ | 0 | 165 | 0 |
| | 2b | 0.4 | — | $10^5$ | 0 | 170 | 0 |
| | 2c | 0.6 | — | $10^5$ | 0 | 165 | 0 |
| | 3a | — | 1 | $10^5$ | 0 | 155 | 0 |
| | 3b | — | 2.5 | $10^5$ | 0 | 165 | 0 |
| | 3c | — | 4 | $10^5$ | 0 | 160 | 0 |
| | 4a | 0.2 | 2.5 | $10^5$ | 0 | 165 | 0 |
| | 4b | 0.4 | 2.5 | $10^5$ | 0 | 170 | 0 |
| | 4c | 0.6 | 2.5 | $10^5$ | 0 | 165 | 0 |
| | 5a | 0.4 | — | $10^6$ | 1 | 160 | 2 |
| | 5b | 0.4 | — | $5 \times 10^4$ | 0 | 155 | 0 |
| | 5c | 0.4 | — | $10^4$ | 0 | 160 | 0 |

A: Titanium density (at. %) in the copper alloy tube.
B: Titanium density (at. %) in the niobium alloy tube.
C: Reducing degree.
D: Filament breakage occurrence (%)
E: Critical current I (A) in the ten Tesla magnetic field at a temperature of 4.2K.
F: Filament injury occurrence (%) of the niobium alloy tube.

In the Table 1, the filament breakages and the filament injuries, expressed by occurrence (%), were obtained by optionally sampling a composite having a suitable length in the form of a filamentary pipe consisting of a large number of filaments, and calculating the numbers of the broken and injured filaments with respect to the total filaments, respectively, by observing the cross sectional area of the cut composite in use of the microscope.

As can be understood from the Table 1, with the multifilament superconductors belonging to the group (1) of the composites 1a, 1b and 1c fabricated by the conventional method, it will be found that the filament breakage and injury occurrences are increased as the reducing ratio increases over the reducing degree of $10^4$. On the contrary, with the multifilament superconductors belonging to the groups (2) through (5) fabricated by the method according to this invention, no filament breakage and the injury were observed up to the reducing degree of $10^5$, and upon reaching the reducing degree of $10^6$, the 2% occurrence of the filament injury and the 1% occurrence of the filament breakage were merely observed. Moreover, as to the critical current ($I_c$), the current conductive condition is improved by 40% when comparing the group (1) of the conventional method with the group (2), for example, of this invention. This improvement of the critical current is based on the improvement of the workability in use of the copper or niobium based alloy tube containing the titanium, and the improvement of the workability is based on the small difference between the hardnesses of the copper based alloy tube and the niobium based alloy tube because of the containing of the titanium.

As described hereinabove with reference to the experimental data, by ensuring that the titanium is contained in at least one of the copper based alloy tube and the niobium based alloy tube, not only the critical current ($j_c$) is increased, but also the high workability of the multifilament superconductor can be achieved. These advantages are further developed so that the niobium alloy based tube can be constructed so as to be thin and have a relatively small diameter, thus sufficiently reducing the diameter of the final product of the multifilament. In addition, the critical bending strain can be made large and the AC loss can also be lowered.

The characteristic features described above are further improved by making 0.1-3.5 at. % titanium be contained in the tin based alloy rod.

EXAMPLE 2

Figure 3:
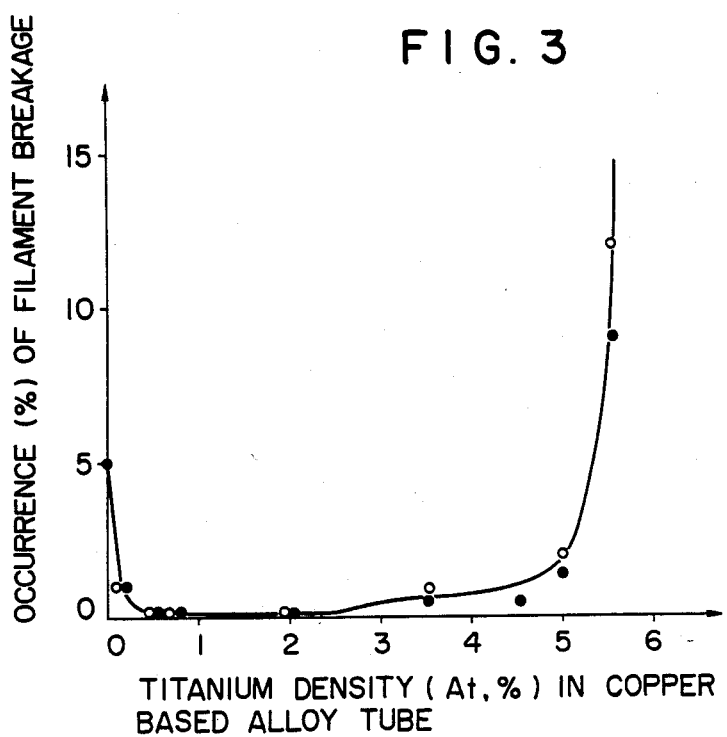
FIGS. 3 and 4 show graphs representing the relationships obtained by the experiments between the titanium amounts contained in the copper and niobium based alloy tubes and the occurrence of the filament breakages, respectively.

A plurality of composites including copper based alloy tubes having the same composite constructions as those of the group (2), i.e., the composites 2a, 2b and 2c in Example 1, but having different densities of titanium contained therein, respectively, were prepared. These plurality of composites were reduced with the reducing degree of $10^5$ and then heat treated at a temperature of 725° C. to thereby form multi-filament superconductors. FIG. 3 shows a graph representing the relationship between the titanium contents in the multifilament superconductors and the filament breakage occurrence (%) measured by the same method as described in Example 1. In FIG. 3, white points represent cases in which are utilized the copper based alloy tubes each obtained by dissolving the copper alloy containing the titanium and then effecting the cooling treatment to the dissolved copper alloy, while black points represent cases in which are utilized the copper based alloy tubes each obtained by heating the dissolved copper alloy at a temperature below its melting point for more than one hour and then rapidly cooling it in water by means of solution heat treatment.

It will be found from FIG. 3 that the occurrence of the filament breakage is significantly reduced by adding the titanium by more than 0.1 at. % and below 5.0 at. %, and on the contrary, when the titanium is added by more than 5.0 at. %, the occurrence of the filament breakage is increased. It was also found that the excellent workability of the multifilament superconductor could be obtained by carrying out the solution heat treatment.

Figure 4:
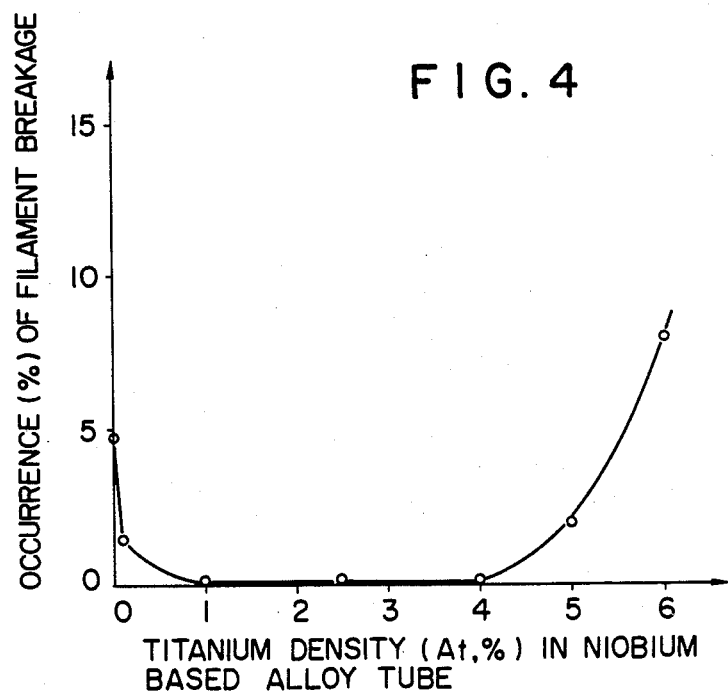

With this Example 2, FIG. 4 shows a graph representing the same relationship as described hereinbefore in conjunction with FIG. 3 with respect to the composites including the niobium based alloy tubes having the same composite constructions as those of the group (3), i.e. the composites 3a, 3b and 3c in Example 1, but having different contents of titaniums contained therein, respectively. These composites were reduced with the reducing degree of $10^5$. It will be found that the addition of titanium of 0.1-5.0 at. % to the niobium based alloy tubes is greatly effective for preventing the filament breakage phenomenon.

EXAMPLE 3

Figure 5:
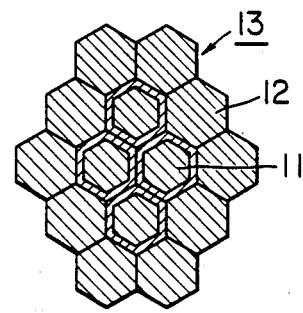
FIG. 5 shows a cross sectional view of a multi-filament superconductor according to the other example of the method of this invention.

FIG. 5 shows a composite 13 comprising a plurality of tin rods 11 clad with copper and bundld into an assembly, and a plurality of copper based alloy rods 12 arranged around the tin rod assembly each containing 0.4 at. % titanium. The composite 13 is reduced to obtain a filamentary tube having a diameter of 5.5 mm. The filamentary tube is clad with a niobium based alloy tube, not shown, having an outer diameter of 8 mm and an inner diameter of 5.6 mm, and the thus obtained filamentary tube is inserted into a copper matrix and then reduced at a reduction degree of $10^6$ to thereby obtain a fine composite having a diameter of 0.8 mm. The fine composite is heat treated to obtain a multi-filament superconductor with an Nb$_3$Sn layer formed inside the niobium based alloy tube.

The critical current of the multifilament superconductor located in the twelve Tesla magnetic field at a temperature of 4.2K was measured to be 165 ampere.

No filament breakage and injury were observed by the methods described with respect to Examples 1 and 2.

With Examples 1 through 3, the multifilament superconductors were obtained by the heat treatment a temperature of 725° C., preferably at a temperature ranging from about 640° to 770° C. Below 640° C., the Nb$_3$Sn layer formation reaction hardly progresses and over 770° C., the diameter of the Nb$_3$Sn grain highly increases, thus extremely lowering the critical current. The titanium is mainly referred to as an element to be added in Examples 1 through 3, but elements such as Ta, Hf, In, Mg, Zr and Ga alone or in combination may be effectively added though the titanium is the best. Furthermore, the addition of titanium into Sn-based alloy rod will be preferably accepted.

In the illustrated graph of FIG. 6, an axis of abscissa represents Sn content (weight %) in Cu-Sn composite and an axis of ordinate represents normalized Jc, which is obtained as ratios of respective samples of Cu-Sn composites including various contents (weight %) of Sn with respect to Jc which is obtained by Sn content of 14 weight % which is deemed as the highest content of Sn in practical use in the conventional method. The experiment for obtaining this result was performed at a treating temperature of 725° C. under magnetic field of 15T.

Moreover, with the Examples 1 through 3, FIG. 6 shows the weight ratio between the Sn rod and Cu clothing the Sn rod. As can be understood from the result of FIG. 6, a remarkably high value of Jc can be obtained in comparison with the conventional method in a case where the Sn content in the Cu-Sn composite in the Nb$_3$Sn-tube method is over 25 weight % and below 85 weight %, and preferably 30-80 weight % in practical use by taking other working factors into considerations.

What is claimed is:

1. A method of fabricating multifilament superconductors comprising the steps of:
   providing a tin rod or tin based alloy rod;
   cladding said rod with a copper based alloy tube, said copper-clad rod having a tin content in the range of about 30 to 80 weight % of said rod; then
   cladding the copper-clad rod with a niobium based alloy tube, at least one of said tubes containing 0.1 to 5.0 at. % titanium;
   applying a copper material as a stabilizer on an outer peripheral surface of said niobium based alloy tube to form a composite; and
   reducing up to a reducing degree that is within a range of from $10^4$ to $10^6$ and then thermally treating said composite at a temperature ranging from 640° to 770° C. to thereby form an Nb$_3$Sn superconductor composite with a filament tube therein.

2. The method according to claim 1, wherein said copper based alloy tube containing the titanium is subject to a heat solution treatment at a temperature below a melting point of said copper based alloy tube.

3. The method according to claim 1, wherein said tin rod or tin based alloy rod is composed of a plurality of tin or tin based alloy rods each outer surface of which is clad with a copper.

4. The method according to claim 1, wherein said copper based alloy tube is composed of a plurality of annular copper based alloy rods formed into a bundle.

5. The method according to claim 2, wherein said copper based alloy tube is composed of a plurality of annular copper based alloy rods formed into a bundle.

6. The method according to claim 3, wherein said copper based alloy tube is composed of a plurality of annular copper based alloy rods formed into a bundle.

7. The method according to claim 1, wherein said tin based alloy rod contains 0.1–3.5 at. % titanium.

8. The method according to claim 2, wherein said tin based alloy rod contains 0.1–3.5 at. % titanium.

9. The method according to claim 3, wherein said tin based alloy rod contains 0.1–3.5 at. % titanium.

10. The method according to claim 4, wherein said tin based alloy rod contains 0.1–3.5 at. % titanium.

11. The method according to claim 1, wherein the thermal treatment of said composite is performed at a temperature of about 725° C.

* * * * *